United States Patent [19]
Ichimura et al.

[11] Patent Number: 5,750,987
[45] Date of Patent: May 12, 1998

[54] ION BEAM PROCESSING APPARATUS

[75] Inventors: Satoshi Ichimura, Hitachi; Tadashi Sato, Mito; Kenzo Kobayashi; Shotaro Ohishi, both of Hitachi; Hisao Oonuki, Hitachiohta, all of Japan

[73] Assignee: Hitachi, Ltd., Tokyo, Japan

[21] Appl. No.: 636,974

[22] Filed: Apr. 24, 1996

[30] Foreign Application Priority Data

Apr. 28, 1995 [JP] Japan .................. 7-105884

[51] Int. Cl.⁶ .................................................. H05H 3/00
[52] U.S. Cl. .................................................. 250/251
[58] Field of Search ........................ 250/251, 492.21

[56] References Cited

U.S. PATENT DOCUMENTS

| | | | |
|---|---|---|---|
| 4,851,668 | 7/1989 | Ohno et al. | 250/251 |
| 4,873,445 | 10/1989 | Le Jeune | 250/251 |
| 5,089,710 | 2/1992 | Kikuchi et al. | 250/492.21 |
| 5,399,871 | 3/1995 | Ito et al. | 250/492.21 |
| 5,576,538 | 11/1996 | Sakai et al. | 250/251 |

FOREIGN PATENT DOCUMENTS

| | | |
|---|---|---|
| 63-157887 | 6/1988 | Japan . |
| 5-82075 | 4/1993 | Japan . |
| 5-234562 | 9/1993 | Japan . |
| 6-2166 | 1/1994 | Japan . |
| 6-203785 | 7/1994 | Japan . |

*Primary Examiner*—Bruce Anderson
*Attorney, Agent, or Firm*—Fay, Sharpe, Beall, Fagan, Minnich & McKee

[57] ABSTRACT

When neutralized plasma is generated, the cylindrical electrode 8 is set at a negative potential against the processing chamber 23 by the DC power source 18, so that ions 23 in the neutralized plasma can be collected at the cylindrical electrode 8. Electrons 24 equal to the collected ion charge can be supplied uniformly toward the ion beam 25. Therefore, by allowing the cylindrical electrode to collect ions, the ion collection area can be spread easily, and only by generating neutralized plasma of low density, a sufficient volume of ions can be collected surely from the plasma and a sufficient volume of electrons can be supplied to the ion beam 25 at the same time.

16 Claims, 4 Drawing Sheets

ION BEAM PROCESSING APPARATUS

BACKGROUND OF THE INVENTION

The present invention relates to an ion beam processing apparatus used for ion n beam etching and other procedures, and particularly to an improvement of the ion beam processing apparatus suited to improvement of the neutralization performance of an ion beam and increase of the current and aperture diameter.

The prior art of such an ion beam processing apparatus is disclosed, for example, in Japanese Patent Application Laid-Open 63-157887 as an etching device. Published on Jun. 30, 1988.

This prior art generates plasma by microwave discharge in a neutralizer arranged close to an ion beam and neutralizes the ion beam by supplying electrons to the ion beam from this plasma via a fine aperture. As a result, compared with neutralization of an ion be am using a hollow cathode having a builtin filament discharging thermions, the ion beam processing apparatus can operate for many hours, especially when reactive gas is used, and is suited to neutralization of a reactive ion beam. Since no filament is used, a heavy metal such as tungsten will not contaminate an object to be processed, and clean ion beam processing is possible.

In an ion beam processing apparatus, to make an object to be processed larger and shorten the processing time, increasing the current and aperture diameter of the ion beam processing apparatus is desired. However, the ion beam processing apparatus of the aforementioned prior art is limited in the increasing of the current and aperture diameter for the following reason.

Namely, in the prior art, when an ion beam is increased in current, it is necessary to also increase the electronic current supplied from the neutralizer so as to neutralize it. The neutralization system for supplying electrons from plasma in the neutralizer is required to collect an ion current equal to the electronic current supplied in the neutralizer. However, an increase of the electronic current to be supplied means an increase of ion current collected in the neutralizer. Furthermore, to generate plasma of higher density in the neutralizer, it is necessary to increase the microwave power to be supplied, so that the electron temperature rises and the plasma potential in the neutralizer increases. This means an increase of the collision energy of collected ions with the inner wall of the neutralizer.

When the ion current and ion energy colliding with the inner wall of the neutralizer increase like this, conductive particles sputtered by ion impulse from the inner wall of the neutralizer are attached to the microwave introduction window, so that a problem arises that not only can the microwave not be supplied satisfactorily but also the generation of plasma is adversely affected and the processing time is increased.

To introduce a large quantity of electrons into the processing chamber, it is necessary to drop the neutralizer to a high negative potential against the processing chamber. Therefore, a problem arises that, since the electron energy after being pulled out from the neutralizer increases, the beam plasma potential is disturbed and the ion beam diverges.

Furthermore, a problem arises that since the location (outlet) for supplying electrons to the ion beam is local, as the aperture diameter of the ion beam increases, the uniformity of neutralization gets worse.

Therefore, in the neutralization system of the prior art, it is difficult to obtain a uniform ion beam with a large current and a large aperture such as 300 mA or more and a large aperture diameter of 200 mm or more,. to neutralize stably for many hours, and further to obtain an ion beam of little divergence.

SUMMARY OF THE INVENTION

In view of the above problems of the prior art, an object of the present invention is to provide an ion beam processing apparatus for neutralizing an ion beam with a large current and a large aperture diameter uniformly, and realizing an ion beam process having little divergence, another object is to provide an ion beam processing apparatus for reducing wear of the ion pulling-out electrode and preventing leakage of the microwave.

The present invention is characterized in that the ion beam processing apparatus comprises an ion source having an ion pulling-out electrode for generating plasma and pulling out ions from the plasma, a processing chamber connected to the ion source for processing an object to be processed by the pulled-out ion beam, and a neutralization means for electrically neutralizing the ion beam in the processing chamber. The neutralization means is installed between the ion source and the processing chamber along the axial direction, and comprises a cylindrical electrode forming a space chamber surrounding the ion beam pulled out by the ion pulling-out electrode, a generation means for generating microwave plasma in the space chamber of the cylindrical electrode, and a means for dropping the cylindrical electrode to a negative potential with respect to the processing chamber.

As mentioned above, the present invention comprises an ion source having an ion pulling-out electrode for generating plasma and pulling out ions from the plasma, a processing chamber connected to the ion source for processing an object to be processed by the pulled-out ion beam, and a neutralization means for electrically neutralizing the ion beam in the processing chamber, so that the ion source is set at a positive potential with respect to the processing chamber when it is connected to the positive (+) pole of the DC power source, and when the ion pulling-out electrode is set at a negative potential, ions are pulled out from plasma generated in the plasma generation chamber into the neutralization means and the processing chamber as an ion beam by the ion pulling-out electrode. When the ion beam is pulled out, it is electrically neutralized by the neutralization means and when the neutralized ion beam is irradiated to an object to be processed, the desired process is executed. When neutralized plasma is generated by the neutralization means, ions in the neutralized plasma can be collected at the cylindrical electrode because the cylindrical electrode is set at a negative potential with respect to the processing chamber. Electrons equal to the collected ion charge can be supplied uniformly toward the ion beam. Since electrons are supplied to the ion beam like this, the ion beam is prevented from convergence due to the space charge and the ion beam can be electrically neutralized surely.

In this case, since ions are collected at the cylindrical electrode, the ion collection area can be spread easily. As a result, only by generating neutralized plasma of low density, a sufficient volume of ions can be collected surely from the plasma and a sufficient volume of electrons can be supplied to the ion beam at the same time. In this case, neutralized plasma of low density can be generated by a small amount of electric energy of the microwave introduced, so that the aforementioned neutralized plasma becomes quiet plasma at a low electron temperature. Accordingly the energy of electrons supplied from here is small and divercence of the beam can be suppressed as much as possible.

DETAILED DESCRIPTION OF THE PREFERRED EMBODIMENTS

Figure 1:
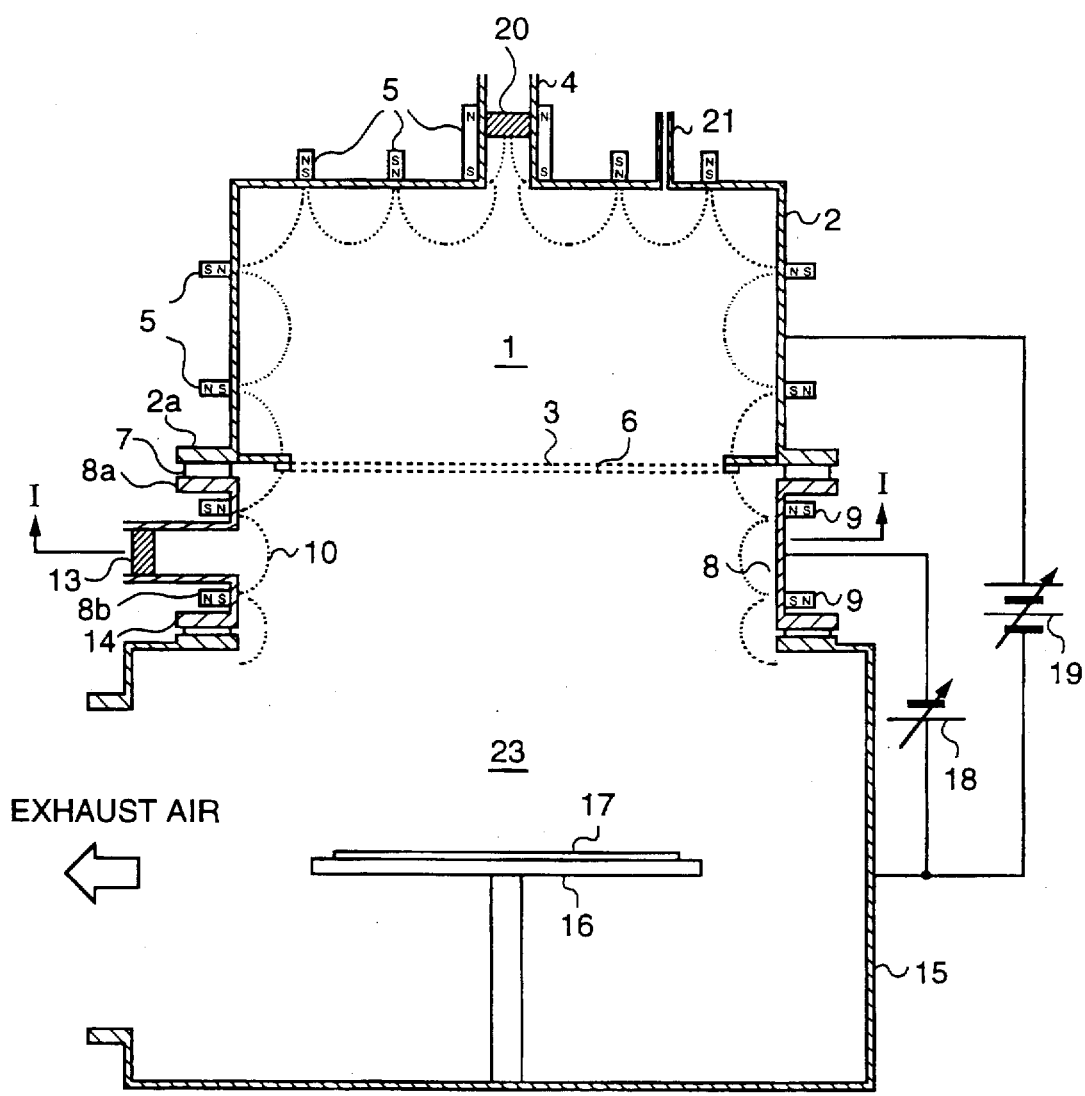
FIG. 1 is a longitudinal cross sectional view of the whole constitution showing the first embodiment of the ion beam processing apparatus of the present invention.
Figure 2:
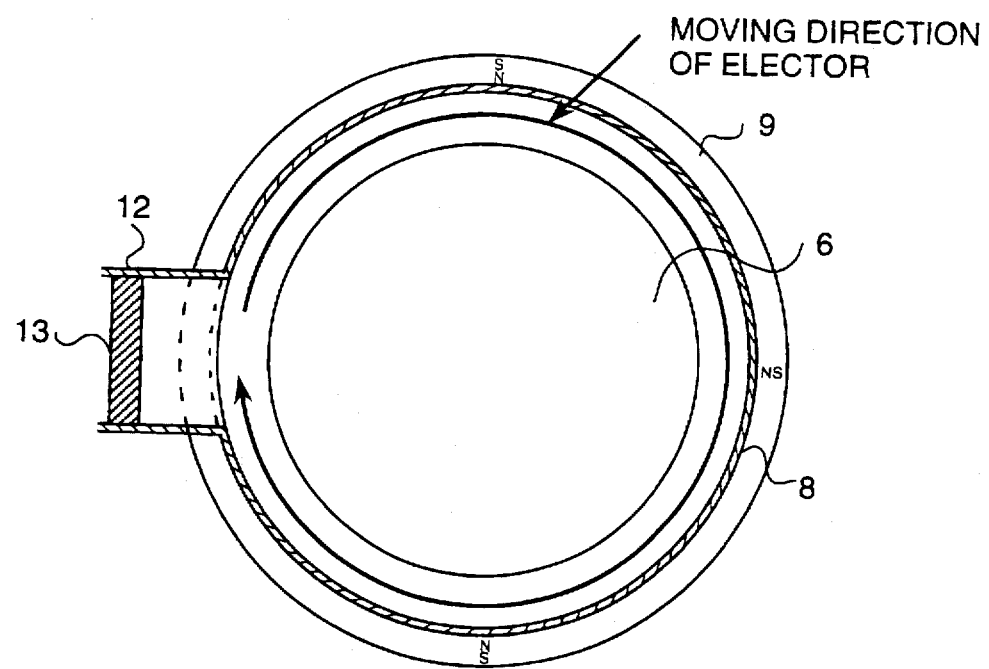
FIG. 2 is a cross sectional view of the line I—I in the FIG. 1
Figure 3:
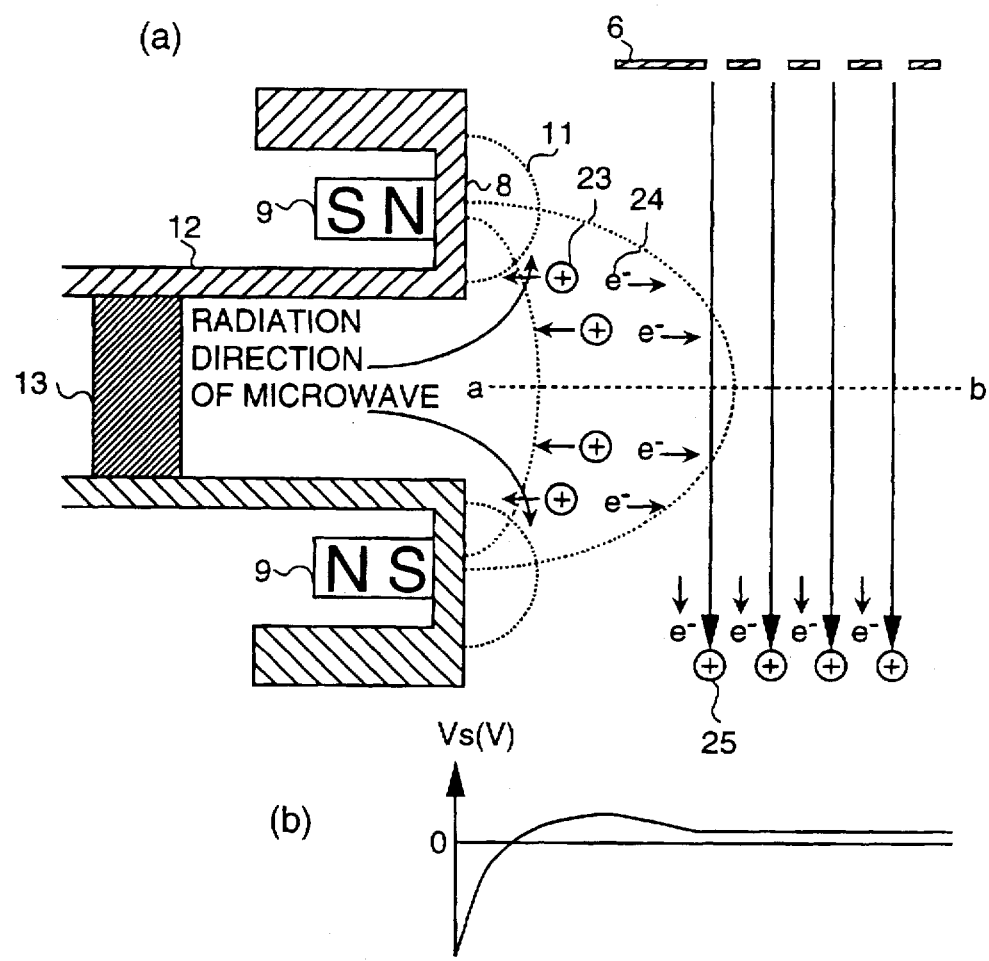
FIG. 3 is an enlarged cross sectional view (a) for illustrating the essential section of FIG. 1 and an illustration (b) showing the space potential distribution.

The embodiments of the present invention will be explained hereunder with reference to FIGS. 1 to 4. FIG. 1 is a longitudinal cross sectional view of the whole constitution showing the first embodiment of an ion beam processing apparatus of the present invention, FIG. 2 is a cross sectional view of the line I—I shown in FIG. 1, and FIG. 3 is a cross sectional view of an essential section of the processor shown in FIG. 1.

The ion beam processing apparatus of the embodiment shown in FIG. 1 has an ion source for generating plasma by microwave discharge. A plasma generation chamber 1 of the ion source is partitioned by a generation chamber wall 2, and a waveguide 4 and a gas introduction tube 21 are connected to the generation chamber wall 2 respectively. The plasma generation chamber 1 is structured so that the inner diameter in the horizontal direction shown in FIG. 1 is 400 mm and the depth in the vertical direction is 200 mm, The generation chamber wall 2 is made of a nonmagnetic material such as stainless steel and the lower end thereof is open. The waveguide 4 is connected to the center of the top of the plasma generation chamber 1 and supplies a microwave with a frequency of 2.45 GHz to the plasma generation chamber 1. A microwave introduction window 20 is attached to the waveguide 4 so as to keep airtightness. The gas introduction tube 21 is used to supply a special gas necessary for plasma generation, for example, sulfur hexafluoride to the plasma generation chamber 1.

A permanent magnet train 5 is arranged in the periphery of the generation chamber wall 2. The permanent magnet train 5 has a first permanent magnet section arranged in a location on the side of the waveguide 4 so as to surround it, and a second magnet section arranged so as to surround the first permanent magnet section on the top of the generation chamber wall 2. A third permanent magnet section is arranged on the upper part of the peripheral surface of the side of the generation chamber wall 2 so as to surround the peripheral surface and a fourth permanent magnet section is arranged below it. A static magnetic field (shown by dashed lines) having an electronic cyclotron resonance magnetic field is generated in the plasma generation chamber 1 by the first to fourth permanent magnet sections.

Furthermore, at the opening of the generation chamber wall 2, a screen electrode 3 having a plurality of holes which are arranged at predetermined intervals and formed in predetermined sizes is attached, and an ion pulling-out electrode 6 having holes corresponding to those of the screen electrode 3 is attached below the screen electrode 3. The ion pulling-out electrode 6 pulls ions downward from plasma generated in the plasma generation chamber 1. The areas in which a plurality of holes of the ion pulling out electrode 6 and the screen electrode 3 are distributed are 300 mm in diameter.

A processing chamber 23 is connected to the lower part of the plasma generation chamber 1 via a neutralization means which will be described later. The processing chamber 23 is a space for processing an object 17 to be processed by an ion beam and partitioned by a processing chamber wall 15 made of a nonmagnetic material such as stainless steel. The object to be processed 17 is supported on a support 16.

On the other hand, the neutralization means has a cylindrical electrode 8 connected between the generation chamber wall 2 and the processing chamber wall 15 and a waveguide 12 attached to the periphery of the cylindrical electrode 8 perpendicularly to the axial direction.

The cylindrical electrode 8 is a cylinder made of nonmagnetic stainless steel which is, for example, 400 mm in inner diameter and 100 mm in depth (height) or so. A flange section 8a formed at one end in the axial direction is connected to a flange section 2a at the lower end of the generation chamber wall 2 via an insulation spacer 7, and a flange section 8b formed at the other end in the axial direction is connected to the processing chamber wall 15 via an insulation spacer 14.

The cylindrical electrode 8 surrounds an ion beam pulled out from plasma in the plasma generation chamber 1 by the ion pulling-out electrode 6, and two sets of permanent magnet trains 9 are arranged on the periphery thereof along the axial direction (vertical direction) with the polarities different from each other. The permanent magnet trains 9 are used to form a multi-ring cusp magnetic field 10 having an electronic cyclotron resonance magnetic field in the vacuum vessel as the cylindrical electrode 8. The permanent magnetic trains 9 are made of, for example, samarium cobalt (residual magnetic flux density about 11000 G) of 6 mm thickness (width) and 20 mm in length in the magnetization direction. In this example, each of them is integrated. However, they may be divided in the peripheral direction according to production.

The waveguide 12 is attached to the periphery of the cylindrical electrode 8 perpendicularly to the axial direction. The waveguide 12 is arranged between the two sets of permanent magnet trains 9 on the periphery of the cylindrical electrode 8 and introduces a microwave with a frequency of 2.45 GHz from between the adjacent magnetic poles of the multi-ring cusp magnetic field 10 in the cylindrical electrode 8. The permanent magnet trains 9 form the multi-ring cusp magnetic field 10 and generate an electronic cyclotron resonance magnetic field 11 corresponding to the frequency of the microwave as shown in FIG. 3.

The waveguide 12 is equipped with a microwave introduction window 13 made of quartz or alumina so as to introduce microwave energy and keep airtightness at the same time in the same way as with the waveguide 4. The size of the waveguide 12 is the same as that of the waveguide 4, such as 27 mm in width and 96 mm in depth as shown in FIG. 1.

Furthermore, the negative (–) pole of a DC power source 18 is connected to the cylindrical electrode 8 and the positive (+) pole thereof is connected to the processing chamber wall 15 at the same time, so that the cylindrical electrode 8 is at a negative potential with respect to and the processing chamber 23.

Namely, the neutralization means is installed between the plasma generation chamber 1 having the ion pulling-out electrode 6 and the processing chamber 23 along the axial direction and structured so as to have the cylindrical electrode 8 forming a space chamber surrounding an ion beam pulled out by the ion pulling-out electrode 6, a generation means comprising the waveguide 12 and the permanent magnet trains 9 for generating microwave plasma in the space chamber of the cylindrical electrode, and the DC power source 18 for dropping the cylindrical electrode 8 to a negative potential with respect to the processing chamber 23.

The negative (−) pole of the DC power source 19 is connected to the processing chamber wall 15 and the positive (+) pole is connected to the generation chamber wall 2 at the same time. The spacer 7 is made of alumina about 10 mm in thickness and the spacer 14 is made of fluororubber, whose thickness after compression is about 1 mm.

Since the ion beam processing apparatus in this embodiment has the aforementioned constitution, the operation thereof will be explained next.

Firstly, the processing chamber 23 is exhausted by using a vacuum pump which is not shown in the drawing, in the direction of the arrow to $1\times10^{-6}$ Torr or less. Next, a specific gas such as sulfur hexafluoride is supplied into the plasma generation chamber 1 via the gas introduction tube 21 so as to increase the pressure in the plasma generation chamber 1 to $5\times10^{-5}$ to $5\times10^{-4}$ Torr and then microwave energy of 2.45 GHz is introduced by the waveguide 4.

By doing this, the supplied gas is changed to plasma by the microwaves in the plasma generation chamber 1. In a location with a magnetic field intensity at which the electronic cyclotron resonance frequency in the plasma agrees with the frequency of the microwave, about 875 Gauss in this example, the microwaves are efficiently absorbed by electrons in the plasma, and electrons of high thus generated ionize the gas, and high-density plasma can be generated.

In this case, when the generation chamber wall 2 of the ion source is set at a positive potential with respect the processing chamber 23 by connecting it to the positive (+) pole of the DC power source 19, and moreover when the ion pulling-out electrode 6 is set at a negative potential, only ions are pulled out from the high-density plasma in the plasma generation chamber 1 as an ion beam into the neutralization means and the processing chamber 23 by the ion pulling-out electrode 6. When the ion beam is pulled out, it is electrically neutralized by the neutralization means having the cylindrical electrode 8, the waveguide 12, the permanent magnet trains 9, and the DC power source 18 when the neutralized ion beam is irradiated to the object 17 to be processed, the desired process is executed.

The voltage applied to the ion source is about 200 to 5000 V and the voltage applied to the ion pulling-out electrode 6 is about −50 to −1000 V.

Next, the neutralization operation by the neutralization means will be explained.

When the ion beam is pulled out by the ion pulling-out electrode 6, since the microwave energy with a frequency of 2.45 GHz is introduced by the waveguide 12, the multi-ring cusp magnetic field 10 is formed by the permanent magnet trains 9, and the electronic cyclotron resonance magnetic field 11 is also formed, in the location of the electronic cyclotron resonance magnetic field 11 which is inside the cylindrical electrode 8, the microwave energy is resonated with and absorbed by electrons and hence electrons of high energy are generated around the cylindrical electrode 8.

The high-energy electrons ionize gas in the space chamber of the cylindrical electrode 8. In this case, however, as shown in FIG. 2, the high-energy electrons ionize gas by turning between the adjacent magnetic poles of the multi-ring cusp magnetic field 10 along the lines of magnetic force in the circumferential direction as shown by the arrow by the magnetic field gradient drifting operation, so that uniformly neutralized plasma can be generated along the periphery of the cylindrical electrode 8.

Moreover, the neutralized plasma is thickened as shown by the shadow part in FIG. 3(a) and the closing status of plasma is satisfactory, so that it is generated in contact with the cylindrical electrode 8 and the ion beam. Therefore, the neutralized plasma is generated on the front of microwave energy introduced by the waveguide 12 in the space chamber of the cylindrical electrode 8, so that the introduced microwave energy is apt to reach the location of the electronic cyclotron resonance magnetic field because the propagation direction thereof diffracts as shown in FIG. 3(a) and electrons can absorb the microwaves efficiently.

When the neutralized plasma is generated like this, the cylindrical electrode 8 is set at a negative potential with respect to the processing chamber 23 by the DC power source 18, so that ions 24 in the neutralized plasma can be collected at the cylindrical electrode 8. Electrons 24 equal to the collected ion charge can be supplied uniformly toward an ion beam 25.

As a result, the pulled-out ions 24 are collected at the cylindrical electrode 8 and the electrons 24 equivalent to the collected ion charge are supplied to the ion beam 25, so that the ion beam can be prevented from divergence due to the space charge thereof and electrically neutralized surely.

Therefore, when the cylindrical electrode 8 is installed between the plasma generation chamber 1 and the processing chamber 23 and ions are collected at the cylindrical electrode 8, the ion collecting area can be spread. As a result, only by generating lowdensity neutralized plasma, a sufficient amount of ions can be collected surely from this plasma and a sufficient amount of electrons can be supplied to the ion beam 25 at the same time. In this case, low-density neutralized plasma can be generated by a small amount of power of microwave energy introduced, so that the neutralized plasma becomes quiet plasma at a low electron temperature; hence, electrons of low energy can be supplied and divergence of the beam can be suppressed as much as possible.

As the aforementioned low-density plasma, it is desirable to generate plasma having lower than the cut-off density, so that the microwave introduction window 13 of the waveguide 12 can be separated from the plasma and particles emitted from the processing chamber 23 can be prevented from attaching. Furthermore, the waveguide 12 is attached to the periphery of the cylindrical electrode 8 at the location perpendicular to the axial direction in the embodiment shown in the drawing, so that conductive particles emitted from the processing chamber 23 are not attached to the surface of the microwave introduction window 13 and the processing such as etching can be executed for many hours even if the object 17 to be processed is conductive. Therefore, a problem caused by attachment of conductive particles to the microwave introduction window 13 in the prior art can be solved.

Furthermore, as mentioned above, the permanent magnet trains 9 form the multi-ring cusp magnetic field 10 in the cylindrical electrode 8 and high-energy electrons carrying out ionization turn along the circumferential direction of the cylindrical electrode 8 by the magnetic field gradient drifting operation, by moving back and forth between the adjacent magnetic poles along the lines of magnetic force to generate plasma by ionizing gas. Thus, even if the microwave energy is introduced from a local portion on the cylindrical electrode 8, uniform plasma can be generated surely on the ring, and moreover the electron trajectory is closed and the end loss is little, and hence so the plasma generation efficiency can be increased. Furthermore, the microwave energy by the waveguide 12 is introduced into the cylindrical electrode 8 from between the magnetic poles of the multi-ring cusp magnetic field 10, so that the microwave energy is apt to reach the location of the electronic cyclotron resonance magnetic field because the propagation direction diffracts and the microwave absorption efficiency becomes more satisfactory.

Furthermore, this embodiment also produces the following operation effects. Namely, the cylindrical electrode 8, the permanent magnet trains 9, and the waveguide 12 are arranged in the location immediately after the beam is pulled out by the ion pulling-out electrode 6 in the ion beam pulling-out direction. Therefore, compared with a case that they are arranged on the downstream side of the location, for example, in the neighborhood of the object 17 to be processed, the embodiment has effects such that (1) it is easy to suppress divergence of the beam, and (2) the object 17 to be processed is not exposed to the neutralized plasma, and (3) the neighborhood of the object to be processed can be exhausted easily and the exhaust conductance made high.

FIG. 3(a) shows that a space potential having a peak in the thick portion of the neutralized plasma is formed and the space potential is based on the potential of the processing chamber 23. The space potential lowers in the radial direction of the cylindrical electrode 8 in the area where the ion beam 25 passes and it can be understood that a convergent electrostatic lens effect is produced on the ion beam. The distribution status of the space potential can be controlled by changing the microwave power supplied and the voltage applied, so that the convergence and divergence effect of the beam can be controlled easily.

Figure 4:
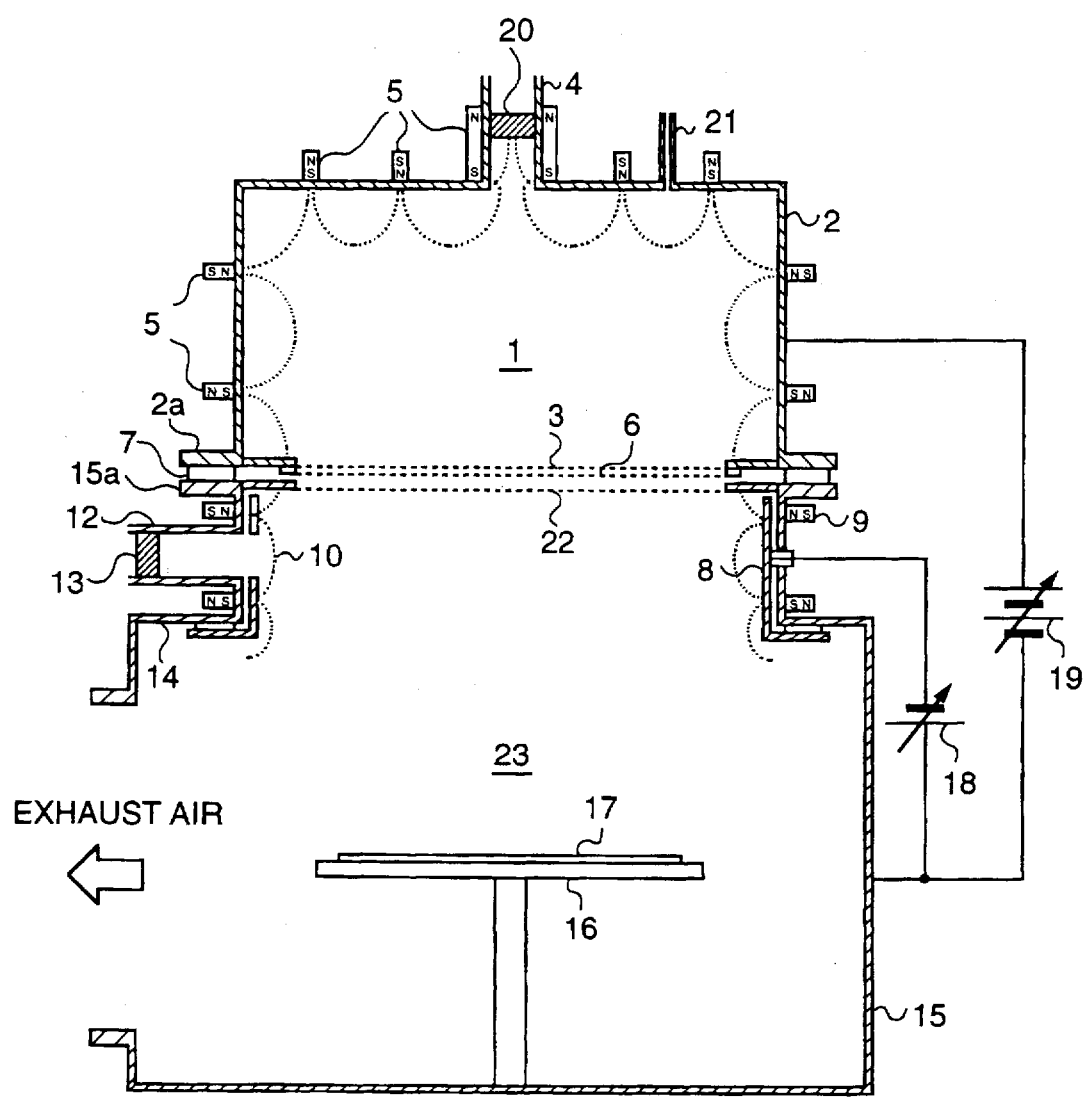
FIG. 4 is a longitudinal cross sectional view showing another embodiment of the ion beam processing apparatus of the present invention.

FIG. 4 shows another embodiment of the ion beam processing apparatus of the present invention.

In the first embodiment mentioned above, the ion pulling-out electrode 6 is set at a negative potential of minus (−) several hundred V against the processing chamber 23 so as to prevent electrons in the neutralized plasma from flowing backward to the ion source. However, when the ion pulling-out electrode 6 is set at such a high negative potential, ions in the neutralized plasma collide with the ion pulling-out electrode 6 with an energy higher than the threshold value of sputtering, and there is a possibility that the ion pulling-out electrode 6 wears out.

When the neutralized plasma is generated, the waveguide 12 introduces the microwave energy in the location close to the ion source, so that there is a possibility that the microwave energy leaks outside through the insulation spacer 7 insulating between the ion source and the cylindrical electrode 7 electrically. In this case, the microwave energy also leaks through the insulation spacer 14. However, the insulation spacer 14 is sufficiently thin compared with the insulation spacer 7, so that the leakage degree is extremely low.

This embodiment is provided so as to solve the two above problems.

Namely, the difference in this embodiment from the first embodiment is that the cylindrical electrode 8 is arranged inside the processing chamber wall 15. Concretely, in the processing chamber wall 15 in this case, the flange section 15a at the top thereof is connected to the flange section 2a of the generation chamber wall 2 via the insulation spacer 7. The cylindrical electrode 8 is installed on the inner periphery on the side of the flange section 15a of the processing chamber 15, so that the cylindrical electrode 8 is installed between the ion source and the processing chamber 23. The negative (−) pole of the DC power source 18 is connected to the cylindrical electrode 8 and set at a negative potential with respect to the processing chamber 23. The waveguide 12 is attached to the outer periphery on the side of the flange section 15a of the processing chamber wall 15 so as to introduce the microwave energy inside the cylindrical electrode 8. In the locations on both sides of the waveguide 12 on the outer periphery of the processing chamber wall 15, the permanent magnet trains 9 are arranged in the axial direction so that the magnetic poles are different from each other.

According to this embodiment, a protective electrode 22 which is arranged contiguously to the ion pulling-out electrode 6 and inside the cylindrical electrode 8 is installed. The protective electrode 22 has a plurality of holes in the same way as with the ion pulling-out electrode 6, is attached to the inside of the flange section 15a of the processing chamber wall 15 via a support 23, and is in close contact with the processing chamber wall 15 electrically in the circumferential direction. In this case, "electrically in close contact with" means that the distance between them is sufficiently short compared with the wave length of the microwave introduced from the waveguide 12 and they are electrically in contact with each other.

According to this embodiment, the protective electrode 22 is arranged contiguously to the ion pulling-out electrode 6 and inside the cylindrical electrode 8, so that although ions of the neutralized plasma attempt to collide with the ion pulling-out electrode 6, they collide with the protective electrode 22 before it, and hence the ion pulling-out electrode 6 can be protected surely from wear. Furthermore, the protective electrode 22 is at the same potential as that of the processing chamber 23, so that even if ions collide with it, they will be sputtered little. The protective electrode 22 is in close contact with the processing chamber 23 electrically in the circumferential direction, so that the microwave can be protected from leaking outside from between the ion source and the processing chamber 23.

In this example, the protective electrode 22 is in close contact with the processing chamber 23 electrically in the circumferential direction. However, even if the protective electrode 22 is electrically in close contact with the cylindrical electrode 8 described in the first embodiment mentioned above, the ion pulling-out electrode 6 can be protected from wear and the microwave can be prevented from leaking outside from between the ion source and the cylindrical electrode 8 in the same way.

In every embodiment shown in FIGS. 1 to 4, an example that one waveguide 12 is attached to the cylindrical electrode 8 is shown. However, by attaching a plurality of waveguides, an ion beam with a large aperture diameter and a large current can be neutralized and a larger aperture diameter and a larger current can be realized. An example that the permanent magnet trains 9 and the waveguide 12 are used as a means for generating plasma in the cylindrical electrode 8 is shown. However, since plasma can be generated by attaching an antenna along the cylindrical electrode 8, a means of an antenna may be used for them.

Furthermore, to generate a multi-ring cusp magnetic field inside the cylindrical electrode 8, an example that the permanent magnet trains 9 are arranged on the outer periphery of the cylindrical electrode 8 is shown. However, even if they are arranged on the inner periphery, an operation effect which is the same as that of the aforementioned embodiment is obtained. Particularly when they are arranged on the inner periphery, a multi-ring cusp magnetic field having a comparatively strong intensity can be formed, so that there is an advantage that the plasma closing status is satisfactory and neutralized plasma can be generated much the more easily.

As mentioned above, according to the present invention, the ion beam processing apparatus is structured so that the ion collecting area can be spread by allowing the cylindrical electrode 8 to collect ions. Therefore, only by generating low-density neutralized plasma, a sufficient amount of ions can be collected surely from this plasma, and a sufficient amount of electrons can be supplied to an ion beam at the same time, and only a small amount of power of a microwave introduced is sufficient, and the energy of electrons is much the more smaller, and the beam can be suppressed from divergence as much as possible, and moreover neutralized plasma is generated in a ring shape surrounding the ion beam, and electrons can be supplied uniformly in the circumferential direction from there. As a result, an effect that the ion beam processing apparatus can respond to a large current and a large aperture diameter easily and surely can be produced.

If the ion beam processing apparatus is structured so that the protective electrode is installed in a location on the side of the ion pulling-out electrode and ions in the neutralized plasma are collected by the protective electrode before they collide with the beam pulling-out electrode, an effect that the ion pulling-out electrode can be surely suppressed from wear is produced. Furthermore, the protective electrode is supported electrically closely in the circumferential direction, so that an effect that the microwave is prevented from leaking from between the processing chamber and the ion source is produced.

We claim:

1. An ion beam processing apparatus including an ion source having an ion pulling-out electrode for generating a plasma and for pulling out ions from said plasma, and a processing chamber connected to said ion source for receiving an ion beam of said pulled-out ions and for processing an object to be processed by said ion beam, said ion beam processing apparatus comprising:

neutralization means installed between said ion source and said processing chamber, for electrically neutralizing said ion beam supplied to said processing chamber;

a cylindrical electrode defining a space chamber therein, in which said ion beam pulled out by said ion pulling-out electrode passes;

generation means for generating a microwave plasma in the space chamber in said cylindrical electrode; and means for applying a potential to said cylindrical electrode that is negative with respect to said processing chamber.

2. An ion beam processing apparatus as defined in claim 1, wherein said processor comprises:

a protective electrode for protecting said ion pulling-out electrode from collision with ions in the neutralized plasma, said protective electrode being disposed between said ion pulling-out electrode and said cylindrical electrode, in contact with said cylindrical electrode electrically, and set at the same potential as said cylindrical electrode.

3. An ion beam processing apparatus as defined in claim 1, wherein said static magnetic field generation section is a permanent magnet arranged on the outer periphery or inner periphery of said cylindrical electrode.

4. An ion beam processing apparatus according to claim 1, wherein said microwave introduction section introduces microwave energy from between the adjacent magnetic poles of said multi-ring cusp magnetic field.

5. An ion beam processing apparatus including an ion source having an ion pulling-out electrode for generating a plasma and for pulling out ions from said plasma, and a processing chamber connected to said ion source for receiving an ion beam of said pulled-out ions and for processing an object to be processed by said ion beam, said ion beam processing apparatus comprising:

neutralization means installed between said ion source and said processing chamber, for electrically neutralizing said ion beam supplied to said processing chamber;

a cylindrical electrode defining a space chamber therein, in which said ion beam pulled out by said ion pulling-out electrode passes;

generation means for generating a microwave plasma in the space chamber in said cylindrical electrode; and means for applying a potential to said cylindrical electrode that is negative with respect to said processing chamber;

wherein said generation means comprises a microwave introduction section for introducing microwave energy into said space chamber; and a static magnetic field generation section for forming a multi-ring cusp magnetic field, and for generating an electronic cyclotron resonance magnetic field corresponding to the frequency of said microwave energy from said microwave introduction section.

6. An ion beam processing apparatus as defined in claim 5, wherein said processor comprises:

a protective electrode for protecting said ion pulling-out electrode from collision with ions in the neutralized plasma, said protective electrode being disposed between said ion pulling-out electrode and said cylindrical electrode, in contact with said cylindrical electrode electrically, and set at the same potential as said cylindrical electrode.

7. An ion beam processing apparatus as defined in claim 5, wherein said static magnetic field generation section is a permanent magnet arranged on the outer periphery or inner periphery of said cylindrical electrode.

8. An ion beam processing apparatus according to claim 5, wherein said microwave introduction section introduces microwave energy from between the adjacent magnetic poles of said multi-ring cusp magnetic field.

9. An ion beam processing apparatus, comprising:

an ion source having an ion pulling-out electrode for generating a plasma and for pulling out ions from said plasma;

a processing chamber connected to said ion source for receiving an ion beam of said pulled-out ions and for processing an object to be processed by said ion beam; and neutralization means for electrically neutralizing said ion beam in said processing chamber, said neutralization means being attached in a location of the inner wall of said processing chamber on the side of said ion pulling-out electrode;

wherein said neutralization means comprises a cylindrical electrode forming a space chamber therein in which said ion beam pulled out by said ion pulling-out electrode passes, generation means for generating a microwave plasma in the space chamber of said cylindrical electrode, and means for applying a potential to said cylindrical electrode that is negative with respect to said processing chamber.

10. An ion beam processing apparatus as defined in claim 9, wherein said processor comprises:

a protective electrode for protecting said ion pulling-out electrode from collision with ions in the neutralized plasma, said protective electrode being disposed between said ion pulling-out electrode and said cylindrical electrode, in contact with said cylindrical electrode electrically, and set at the same potential as said cylindrical electrode.

11. An ion beam processing apparatus as defined in claim 9, wherein said processor comprises:

a protective electrode for protecting said ion pulling-out electrode from collision with ions in the neutralized plasma, said protective electrode being disposed between said ion pulling-out electrode and said cylindrical electrode, in contact with said cylindrical electrode electrically, and set at the same potential as said cylindrical electrode.

12. An ion beam processing apparatus as defined in claim 9, wherein said static magnetic field generation section is a permanent magnet arranged on the outer periphery or inner periphery of said cylindrical electrode.

13. An ion beam processing apparatus according to claim 9, wherein said microwave introduction section introduces microwave energy from between the adjacent magnetic poles of said multi-ring cusp magnetic field.

14. An ion beam processing apparatus, comprising:

an ion source having an ion pulling-out electrode for generating a plasma and for pulling out ions from said plasma;

a processing chamber connected to said ion source for receiving an ion beam of said pulled-out ions and for processing an object to be processed by said ion beam; and neutralization means for electrically neutralizing said ion beam in said processing chamber, said neutralization means being attached in a location of the inner wall of said processing chamber on the side of said ion pulling-out electrode;

wherein said neutralization means comprises a cylindrical electrode forming a space chamber therein in which said ion beam pulled out by said ion pulling-out electrode passes, generation means for generating a microwave plasma in the space chamber of said cylindrical electrode, and means for applying a potential to said cylindrical electrode that is negative with respect to said processing chamber; and wherein said generation means comprises a microwave introduction section for introducing microwave energy into said space chamber, and a static magnetic field generation section for forming a multi-ring cusp magnetic field, and for generating an electronic cyclotron resonance magnetic field corresponding to the frequency of said microwave energy from said microwave introduction section.

15. An ion beam processing apparatus as defined in claim 14, wherein said static magnetic field generation section is a permanent magnet arranged on the outer periphery or inner periphery of said cylindrical electrode.

16. An ion beam processing apparatus according to claim 14, wherein said microwave introduction section introduces microwave energy from between the adjacent magnetic poles of said multi-ring cusp magnetic field.

* * * * *